United States Patent
Joshi

(10) Patent No.: US 9,053,853 B1
(45) Date of Patent: Jun. 9, 2015

(54) METHOD OF FORMING A MAGNETICS PACKAGE

(71) Applicant: Rajeev Joshi, Cupertino, CA (US)

(72) Inventor: Rajeev Joshi, Cupertino, CA (US)

(73) Assignee: Flextronics AP, LLC, Broomfield, CO (US)

( * ) Notice: Subject to any disclaimer, the term of this patent is extended or adjusted under 35 U.S.C. 154(b) by 281 days.

(21) Appl. No.: 13/684,452

(22) Filed: Nov. 23, 2012

Related U.S. Application Data

(62) Division of application No. 12/729,082, filed on Mar. 22, 2010, now Pat. No. 8,339,231.

(51) Int. Cl.
*H01F 7/06* (2006.01)
*H01F 41/00* (2006.01)

(52) U.S. Cl.
CPC ..................................... *H01F 41/00* (2013.01)

(58) Field of Classification Search
USPC ......... 29/602.1, 604–607, 840; 336/110, 175, 336/178, 184, 200, 214, 215, 223, 232, 234
See application file for complete search history.

(56) References Cited

U.S. PATENT DOCUMENTS

| | | | |
|---|---|---|---|
| 4,547,961 A * | 10/1985 | Bokil et al. ................... | 29/602.1 |
| 4,622,202 A * | 11/1986 | Yamada et al. ............... | 376/246 |
| 4,901,069 A | 2/1990 | Veneruso | |
| 5,694,030 A | 12/1997 | Sato et al. | |
| 5,929,734 A | 7/1999 | Weiner | |
| 6,512,437 B2 * | 1/2003 | Jin et al. ......................... | 336/178 |
| 6,578,253 B1 | 6/2003 | Herbert | |
| 6,661,327 B1 | 12/2003 | Funk | |
| 6,879,237 B1 | 4/2005 | Viarouge et al. | |
| 7,289,329 B2 | 10/2007 | Chen et al. | |
| 7,321,285 B2 | 1/2008 | Hung et al. | |
| 7,375,608 B2 | 5/2008 | Suzuki et al. | |
| 7,420,451 B2 | 9/2008 | Lee | |
| 7,989,895 B2 | 8/2011 | White et al. | |
| 8,339,231 B1 * | 12/2012 | Joshi ............................ | 336/200 |
| 8,597,988 B2 * | 12/2013 | Shaikevitch et al. ......... | 438/127 |
| 2003/0111759 A1 * | 6/2003 | Wood et al. ................... | 264/131 |
| 2004/0056749 A1 | 3/2004 | Kahlmann et al. | |
| 2005/0073818 A1 | 4/2005 | Hirano et al. | |
| 2007/0180684 A1 | 8/2007 | Wada et al. | |
| 2008/0174396 A1 | 7/2008 | Choi et al. | |
| 2009/0152693 A1 | 6/2009 | Sato | |

FOREIGN PATENT DOCUMENTS

| | | |
|---|---|---|
| TW | 200725653 A | 7/2007 |
| WO | 2005122377 A1 | 12/2005 |

\* cited by examiner

*Primary Examiner* — Paul D Kim
(74) *Attorney, Agent, or Firm* — Haverstock & Owens LLP

(57) ABSTRACT

Embodiments of the present invention relate to a method of forming a magnetics package. The method includes providing a primary coil configured to conduct a current flow; providing a substrate having a surface and a secondary coil extending from the surface, the secondary coil configured to conduct a current flow; encapsulating the secondary coil in a secondary mold compound; removing the substrate from the secondary coil, thereby leaving the secondary coil embedded in the secondary mold compound; and inductively coupling the secondary coil to the primary coil through a magnetic core, the secondary coil is electrically isolated from the primary coil, wherein a current flow in the primary coil produces a magnetic field in the magnetic core, and the magnetic field in the magnetic core induces a current flow in the secondary coil.

20 Claims, 4 Drawing Sheets

METHOD OF FORMING A MAGNETICS PACKAGE

RELATED APPLICATION(S)

This Patent Application is a divisional application of co-pending U.S. patent application Ser. No. 12/729,082, filed Mar. 22, 2010, U.S. Pat. No. 8,339,231, entitled "Leadframe Based Magnetics Package," which is hereby incorporated by reference.

FIELD OF THE INVENTION

The present invention relates to the field of transformers. More particularly, the present invention relates to leadframe-based magnetics packaging.

BACKGROUND OF THE INVENTION

Chargers and other power supplies use transformers as a means of power conversion from alternating current (AC) to direct current (DC). Unfortunately, transformers do not lend themselves well to miniaturization. In a planar transformer, using a flex circuit patterned with metal forms the primary and secondary coils of the transformer. However, the limitations of the flex circuit manufacture can be quite troublesome. The limited thickness of the copper traces that can be plated or deposited onto the flex substrate in order to form the coils leads to high DC resistances of the coils themselves, translating into lower efficiencies of the transformer (10% lower in some cases). Additionally, because these substrates are very thin, they are difficult to handle and analyze. Furthermore, current transformer technologies typically require about 11 different layers, including adhesive layers and safety layers, to be stacked together. This abundance of layers is problematic with respect to the complexity of manufacturing and the level of cost.

What is needed in the art is a magnetics package that reduces the resistances of the coils, makes them easy to handle, and minimizes both the complexity and cost of manufacturing.

SUMMARY OF THE INVENTION

The present invention utilizes embedding of the coils in a molded leadframe package, which resolves the issues of high DC resistance of the coils. This encapsulation of the coils also provides a platform for integrating the rest of the magnetic components of the transformer into form factors, such as through-hole technology, single in-line packaging, dual in-line packaging, and surface mount technology (e.g., a ball grid array).

In one aspect of the present invention, a magnetics package is disclosed. The magnetics package comprises a primary coil configured to conduct a current flow, and a secondary coil electrically isolated from the primary coil and configured to conduct a current flow. The secondary coil is embedded in a secondary mold compound. The secondary mold compound is preferably a silica-based compound, comprising between approximately 75% and approximately 80% silica. Preferably, the secondary coil comprises a first end, a second end opposite the first end, and a sidewall connecting the first end to the second end, wherein the second end and the sidewall are completely covered by the secondary mold compound, while the first end is the only portion of the secondary coil that is not covered by the secondary mold compound. Ideally, the secondary mold compound and the entire first end of the secondary coil form a substantially planar surface. The magnetics package also comprises a magnetic core inductively coupling the primary coil and the secondary coil. A current flow in the primary coil produces a magnetic field in the magnetic core, and the magnetic field in the magnetic core induces a current flow in the secondary coil.

In another aspect of the present invention, a method for forming a magnetics package is disclosed. The method comprises providing a primary coil configured to conduct a current flow, and providing a substrate having a surface and a secondary coil extending from the surface. The secondary coil is configured to conduct a current flow. The method also comprises encapsulating the secondary coil in a secondary mold compound, then removing the substrate from the secondary coil, thereby leaving the secondary coil embedded in the secondary mold compound. The secondary mold compound is preferably a silica-based compound, comprising between approximately 75% and approximately 80% silica. Preferably, the secondary coil comprises a first end, a second end opposite the first end, and a sidewall connecting the first end to the second end, wherein the second end and the sidewall are completely covered by the secondary mold compound, while the first end is the only portion of the secondary coil that is not covered by the secondary mold compound. Ideally, the secondary mold compound and the entire first end of the secondary coil form a substantially planar surface. The secondary coil is then inductively coupled to the primary coil through a magnetic core, as well as being electrically isolated from the primary coil. A current flow in the primary coil produces a magnetic field in the magnetic core, and the magnetic field in the magnetic core induces a current flow in the secondary coil.

DETAILED DESCRIPTION OF THE PRESENT INVENTION

The following description is presented to enable one of ordinary skill in the art to make and use the invention and is provided in the context of a patent application and its requirements. Various modifications to the described embodiments will be readily apparent to those skilled in the art and the generic principles herein can be applied to other embodiments. Thus, the present invention is not intended to be limited to the embodiment shown, but is to be accorded the widest scope consistent with the principles and features described herein.

Figure 1A:
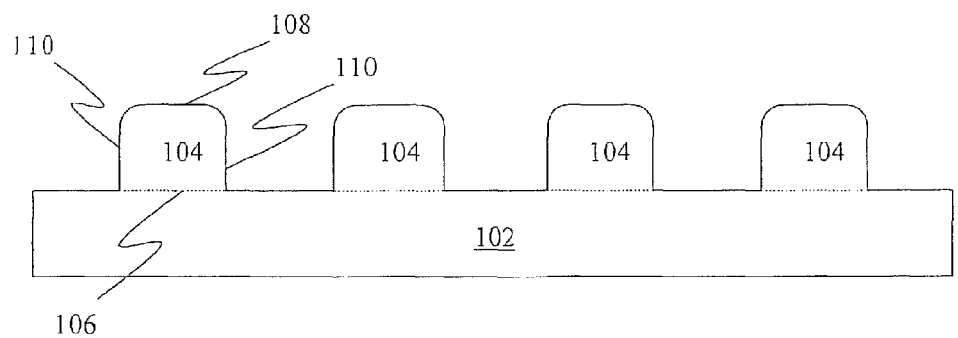
FIGS. 1A through 1C illustrate one embodiment of the formation of an embedded coil in accordance with the principles of the present invention.
Figure 1B:
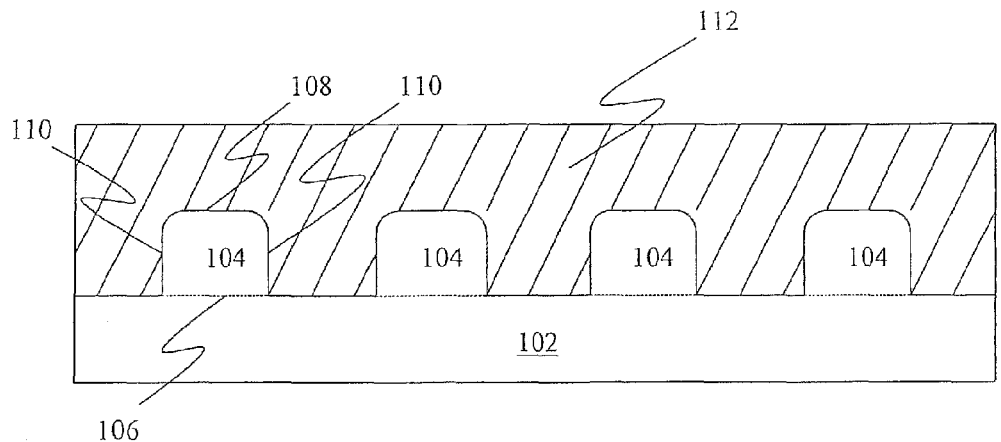
Figure 1C:
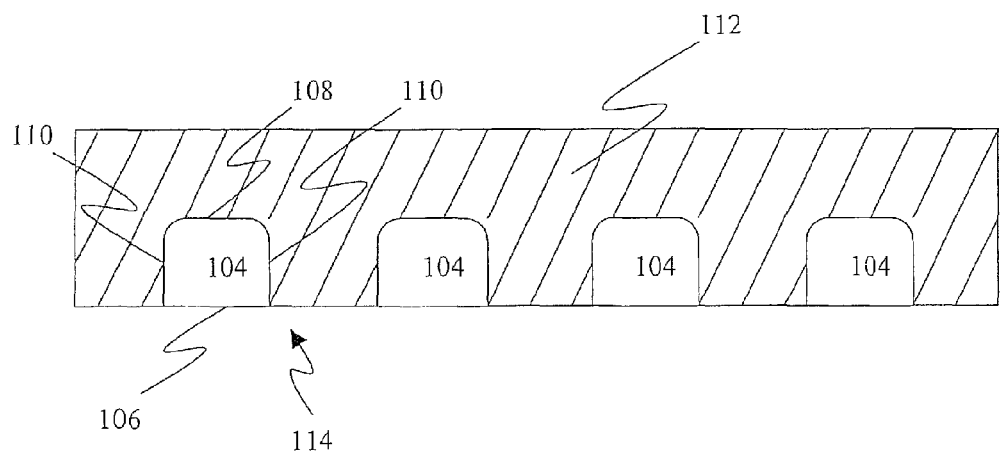

FIGS. 1A through 1C illustrate one embodiment of the formation of an embedded coil in accordance with the principles of the present invention.

In FIG. 1A, a substrate 102 is provided having coils 104 extending from one side of the substrate 102. In a preferred embodiment, the substrate 102 and the coils 104 are formed from copper. However, it is contemplated that other conductive materials can be used as an alternative, or in addition, to copper. Coils 104 have a first end 106 adjacent to the surface of the substrate 102, a second end 108 positioned distally from the surface of the substrate 102, and a sidewall 110 disposed between and connecting the first end 106 and the second end 108. In FIGS. 1A-B, the meeting point between the proximate end 106 and the substrate 102 is illustrated by a dotted line. This dotted line is only intended to help clarify the distinction between the coils 104 and the substrate 102 and should not be used to limit the scope of the present invention beyond what is expressly stated in the claims. Accordingly, the transition between the substrate 102 and the coils 104 can be seamless.

In FIG. 1B, a mold compound 112 is disposed over the coils 104, covering the second end 108 and the sidewall 110. In a preferred embodiment, mold compound 112 is a silica-based compound. For example, mold compound 112 can comprise approximately 75-80% silica. However, it is contemplated that other percentages and other insulating materials can be used to form the mold compound 112.

Once the second end 108 and the sidewall 110 are encapsulated by the mold compound 112, the coils 104 are no longer exposed. The second end 108 and the sidewall 110 are covered by the mold compound 112, and the first end 106 is covered by the substrate 102.

In FIG. 1C, the excess (i.e., exposed) substrate 102 is removed, thereby exposing the first end 106 of the coil 104, while leaving the second end 108 and the sidewall 110 covered. In a preferred embodiment, this removal of the substrate 102 creates a substantially planar surface 114 formed by mold compound 112 and the first end 106 of the coils 104. A separation and isolation is created between the windings of the coil 104 as they are no longer connected by the substrate 102. In a preferred embodiment, the removal process comprises etching off the substrate 102 from the coil 104. However, it is contemplated that the substrate 102 can be removed in a variety of other ways.

Figure 2:
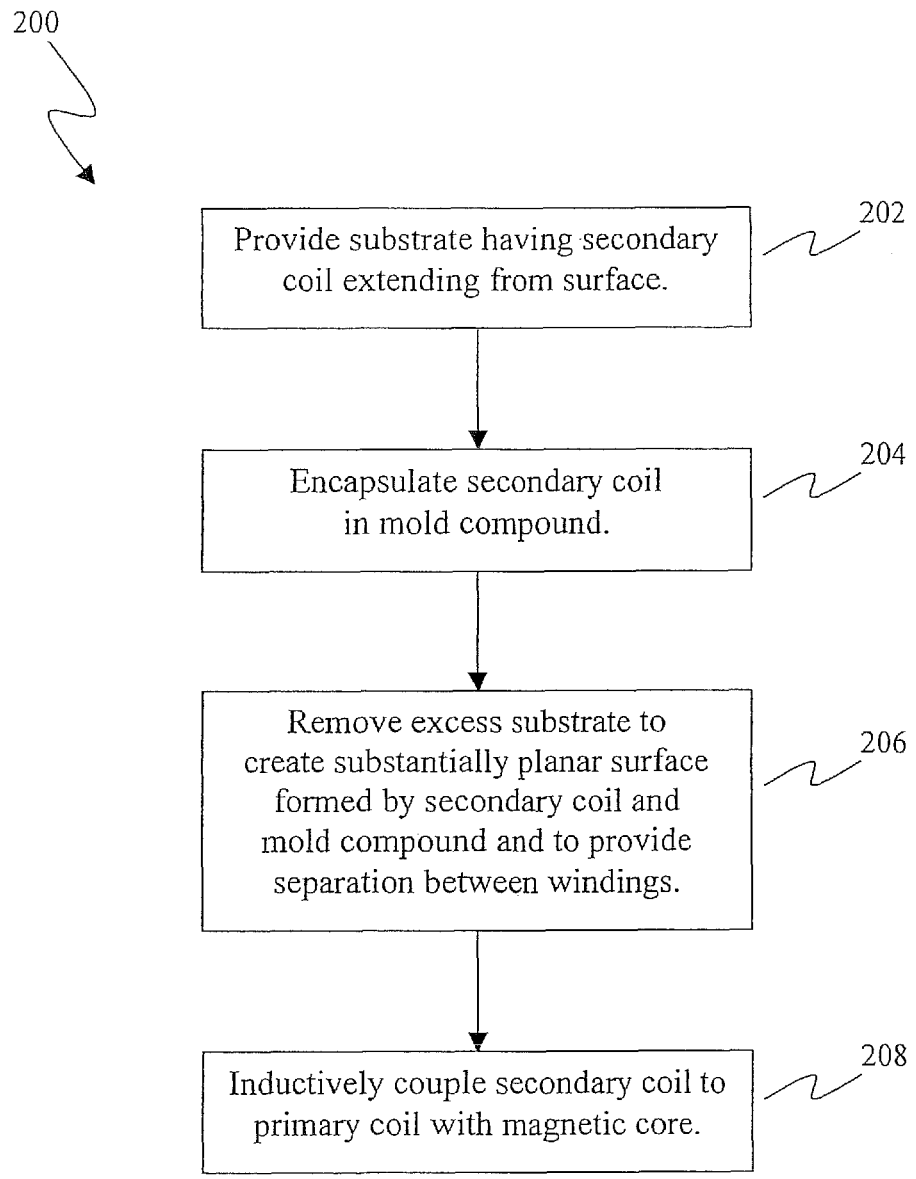
FIG. 2 illustrates one embodiment of a method for forming a transformer in accordance with the principles of the present invention.

As a result of encapsulating the coil with a mold compound and removing the excess substrate, an embedded coil is formed. The resulting embedded coil can be used to form a transformer. FIG. 2 illustrates one embodiment of a method 200 for forming a transformer in accordance with the principles of the present invention.

At step 202, a substrate is provided having a secondary coil extending from its surface, such as discussed with respect to FIG. 1A above.

At step 204, the secondary coil is encapsulated in a mold compound, such as discussed with respect to FIG. 1B above. The mold compound and the substrate work together to completely cover the secondary coil, leaving it unexposed.

At step 206, the substrate is removed, such as discussed with respect to FIG. 1C above. In a preferred embodiment, the removal process comprises etching off the substrate from the coil. However, it is contemplated that the substrate can be removed in a variety of other ways. Preferably, this substrate removal results in the creation of a substantially planar surface formed by the secondary coil and the mold compound. It also provides separation between the windings of the coil, meaning that the only thing connecting windings of the coil is the coil itself, not the substrate.

At step 208, the embedded secondary coil is inductively coupled to a primary coil through a magnetic core, meaning that the secondary coil, the magnetic core and the primary coil are configured such that a current in the primary coil creates a magnetic field in the magnetic core, which induces a current in the secondary coil.

Different configurations of embedded coils can be used in accordance with the present invention. At a minimum, the present invention requires that the secondary coil be embedded in the mold compound as discussed above.

Figure 3A:
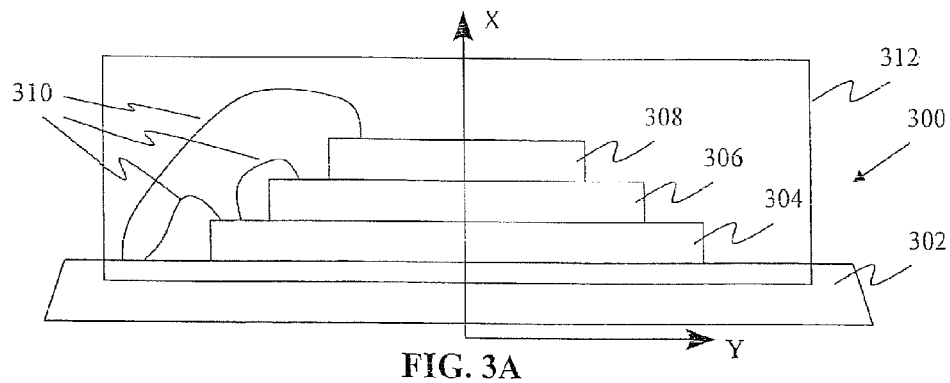
FIG. 3A is a cross-sectional side view of one embodiment of a magnetics package with embedded secondary coils in accordance with the principles of the present invention.
Figure 3B:
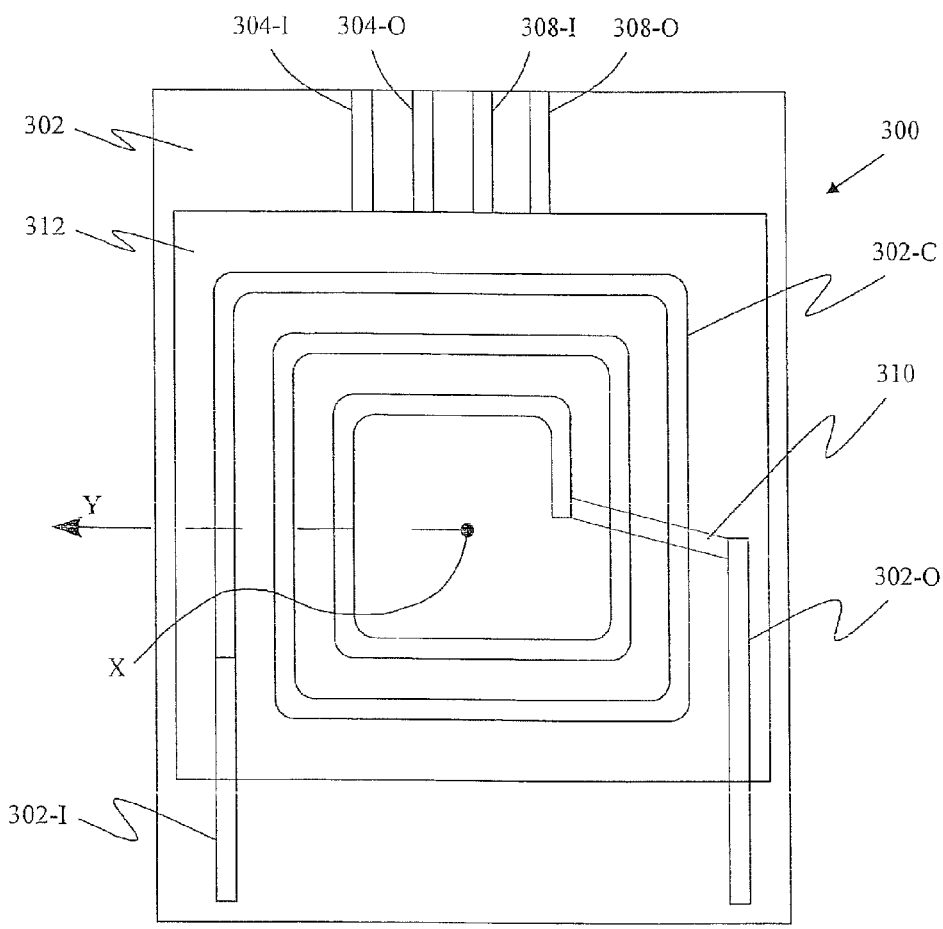
FIG. 3B is a cross-sectional bottom view of the magnetics package of FIG. 3A.

FIGS. 3A-3B illustrate an exemplary embodiment of a magnetics package 300 with embedded secondary coils in accordance with the principles of the present invention. Magnetics package 300 comprises a transformer having a first level of primary coils 304, a second level of primary coils 306, a level of auxiliary coils 308, and a level of secondary coils 302. The level of secondary coils 302 comprises secondary coils 302-C embedded in a mold compound as discussed above. In a preferred embodiment, an input pin 302-I and an output pin 302-O are connected to the secondary coils 302-C. These pins can be connected in a variety of different ways. For example, as seen in FIG. 3B, input pin 302-I can be directly connected to the secondary coils 302-C, while output pin 302-O can be connected to the secondary coils 302-C using wire bond interconnects 310. The coils are preferably formed from wire-bondable metal to allow for the use of such wire-bond interconnects 310. The molding surrounding the secondary coils forms a leadframe that can be used to provide a platform for the components of the transformer. It is noted that the windings of the primary and auxiliary coils have been left out of FIG. 3B in order to provide a clear view of the embedded secondary coils.

In one embodiment, the levels of coils are disposed in step formation, one on top of the other. For example, FIG. 3A shows the first level of primary coils 304 disposed on top of the level of secondary coils 302, the second level of primary coils 306 disposed over the first level of primary coils 304, and the level of auxiliary coils 308 disposed over the second level of primary coils 306, with the horizontal diameter of each level decreasing as you move upwards. The levels can be adhered, fastened, or otherwise secured to each other.

The levels of primary coils 304 and 306 and auxiliary coils 308 can be formed from coils that are patterned, or otherwise deposited, onto a substrate (e.g., a flex substrate), as opposed to being embedded in a mold compound as with the secondary coils. Each level of coils can have a corresponding set of input and output pins. For example, FIG. 3B shows input pin 304-I and output pin 304-O for the first level of primary coils 304, and input pin 308-I and output pin 308-O for the level of auxiliary coils 308. Input pin 304-I and output pin 304-O can also be used for the second level of primary coils 306. These input and output pins can be lateral or dual-sided (such as with dual in-line packaging), and can be disposed on the leadframe formed by the mold compound. The primary and auxiliary coils can be connected to their respective input and output pins on the leadframe using wire-bond interconnects 310, as shown in FIG. 3A. The second level of primary coils 306 can be connected to the leadframe through the first level of primary coils 304. In a preferred embodiment, the primary and auxiliary coils are electrically isolated from the secondary coils.

A final over-molding 312 can be used to cover all of the levels, encasing them together and providing a space within which a magnetic core may be formed. In a preferred embodiment, the coils of each level are exposed to the magnetic core in order to allow a current in one set of coils to create a magnetic field, which will in turn induce a current in another set of coils. An X-Y coordinate axis is provided in FIGS. 3A and 3B to show the arrangement of the several coils. Coils 302-306 are arranged vertically and co-axial about the axis X as shown in FIG. 3A. In FIG. 3B, the axis X directs outward from the paper.

Figure 4:
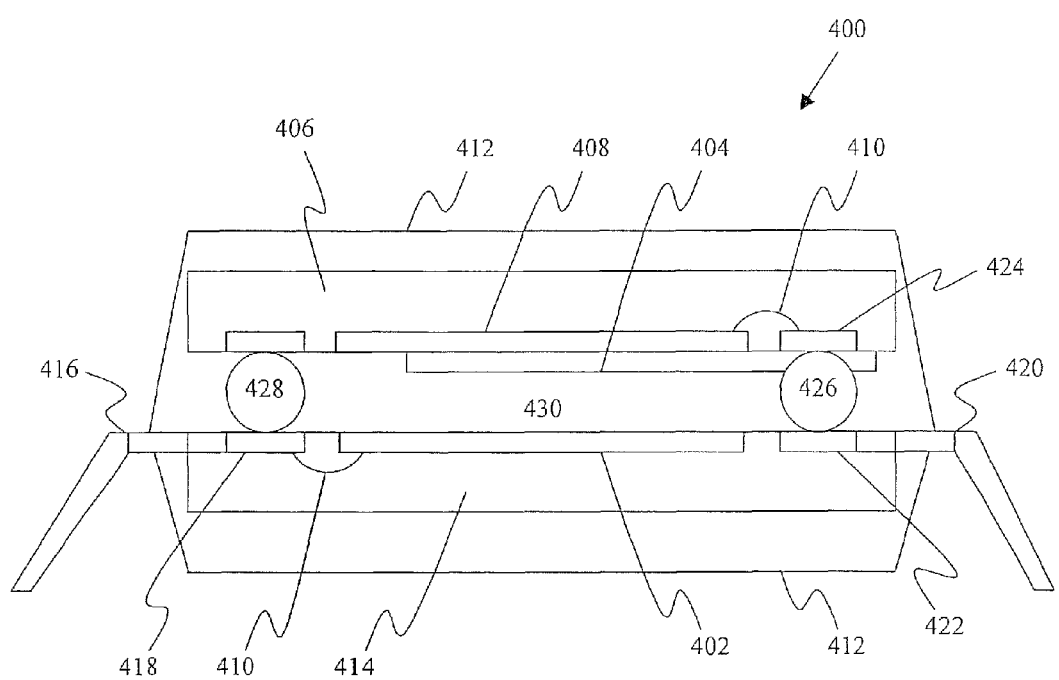
FIG. 4 is a cross-sectional side view of one embodiment of a magnetics package with embedded secondary and auxiliary coils in accordance with the principles of the present invention.

FIG. 4 is a cross-sectional side view of one embodiment of a magnetics package 400 with embedded secondary and auxiliary coils in accordance with the principles of the present invention.

Magnetics package 400 comprises a transformer having primary coils 404, auxiliary coils 408, and secondary coils 402. Secondary coils 402 and auxiliary coils 408 are embedded in mold compounds 414 and 406, respectively, to form leadframes as discussed above. In contrast, primary coils 404 can be patterned on a flex substrate.

The coils can be connected to input and output pins as previously mentioned. For example, the primary coils 404 and the auxiliary coils 408 can be connected to pins such as pin 420, while the secondary coils 402 can be connected to pins such as pin 416. Since FIG. 4 is a side cross-sectional view, pin 420 represents both the input and output pins for the primary coils 404 and the auxiliary coils 408, while pin 416 represents both the input and output pins for the secondary coils 402. The connections to the pins can be achieved in a variety of different ways.

In FIG. 4, the primary coils 404 are connected to a pad 422 of conductive material that is directly connected to pin 420. Pad 422 can be embedded in the mold compound 414 for the leadframe of the secondary coils 402. The primary coils 404 are connected to this pad 422 through one or more solder balls 426. In addition to providing an electrical connection between the primary coils 404 and the pad 422, the solder balls 426 may also serve to provide a mechanical connection between the different components of the magnetics package 400, such as the primary coils and the leadframes of the auxiliary and secondary coils, thereby providing stability.

In FIG. 4, the auxiliary coils 408 are also connected to pin 420 through solder ball 426 and pad 422. It is contemplated that solder ball 426, pad 422 and pin 420 for the auxiliary coils 408 may be separate from the solder ball 426, pad 422 and pin 420 for the primary coils 404. Additionally, instead of being directly connected to solder ball 426, the auxiliary coils 408 may be connected to the solder ball 426 through a pad 424 that is embedded in the mold compound 406 of their leadframe. Since this pad 424 can be segmented from the auxiliary coils 408, a wire-bond interconnect 410 can be employed to complete this electrical connection.

In FIG. 4, the secondary coils 402 are connected to pins 416 through a pad 418 that is directly connected to the pin 416. Similar to pad 424, since this pad 418 can be segmented from the secondary coils 402, a wire-bond interconnect 410 can be employed to complete this electrical connection. One or more solder balls 426 can be used to provide connection between the primary coils 404 and the pad 422. The solder balls 428 may also serve to provide a mechanical connection between the leadframes of the auxiliary and secondary coils in a similar fashion as solder balls 426. However, in contrast to solder balls 426 discussed above, solder balls 428 only provide a mechanical connection, not an electrical connection. In this respect, they can be referred to as "dummy" solder balls.

A final over-molding 412 can be used to cover all of the coils, encasing them together and providing a space within which a magnetic core may be formed. In a preferred embodiment, a cavity 430 is provided between the primary/auxiliary coils and the secondary coils. This cavity 430 is configured to act as a magnetic core, inducing an electrical current in the secondary coils 402 when an electrical current is applied to either the primary coils 404 or the auxiliary coils 408. As an alternative to the cavity 430, it is contemplated that any other type of magnetic core known in the art may be employed in the present invention in order to induce an electrical current in the secondary coils. In a preferred embodiment, the primary and auxiliary coils are electrically isolated from the secondary coils, while all of the coils are exposed to the magnetic core in order to promote the creation of a magnetic field and the induction of an electrical current.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications can be made in the embodiment chosen for illustration without departing from the spirit and scope of the invention as defined by the claims.

What is claimed is:

1. A method of forming a magnetics package, the method comprising:
providing a primary coil configured to conduct a current flow;
providing a substrate having a surface and a secondary coil extending from the surface, the secondary coil configured to conduct a current flow;
encapsulating the secondary coil in a secondary mold compound;
removing the substrate from the secondary coil, thereby leaving the secondary coil embedded in the secondary mold compound; and
inductively coupling the secondary coil to the primary coil through a magnetic core, the secondary coil is electrically isolated from the primary coil, wherein a current flow in the primary coil produces a magnetic field in the magnetic core, and the magnetic field in the magnetic core induces a current flow in the secondary coil.

2. The method of claim 1, wherein:
the secondary coil comprises a first end, a second end opposite the first end, and a sidewall connecting the first end to the second end, and
removing the substrate from the secondary coil results in the second end and the sidewall being completely covered by the secondary mold compound, and the first end being the only portion of the secondary coil that is not covered by the secondary mold compound.

3. The method of claim 1, wherein the step of removing the substrate from the secondary coil results in the secondary mold compound and the entire first end of the secondary coil forming a substantially planar surface.

4. The method of claim 3, wherein the step of removing the substrate from the secondary coil comprises etching off the substrate.

5. The method of claim 1, wherein the secondary mold compound is a silica-based compound.

6. The method of claim 5, wherein the secondary mold compound comprises between approximately 75% and approximately 80% silica.

7. The method of claim 1, wherein the primary coil and the secondary coil comprise copper.

8. The method of claim 1, further comprising:
connecting a primary input pin to the primary coil;
connecting a primary output pin to the primary coil, wherein the primary pins are electrically coupled to the primary coil via a first pad embedded in the secondary mold compound;
connecting a secondary input pin to the secondary coil; and connecting a secondary output pin to the secondary coil, wherein the secondary pins are electrically coupled to the secondary coil via a second pad embedded in the secondary mold compound.

9. The method of claim 1, wherein:
the primary coil comprises a first end, a second end opposite the first end, and a sidewall connecting the first end to the second end; and
the step of providing the primary coil comprises embedding the primary coil in a primary mold compound, wherein the second end and the sidewall are completely covered by the primary mold compound, and the first end is the only portion of the primary coil that is not covered by the primary mold compound.

10. The method of claim 9, wherein the primary coil and the primary mold compound form a primary leadframe, the secondary coil and the secondary mold compound form a secondary leadframe, and the method further comprises mechanically connecting the primary leadframe to the secondary leadframe using a solder ball, wherein a cavity is disposed between the primary leadframe and the secondary leadframe, the cavity forming the magnetic core.

11. The method of claim 10, further comprising encasing the primary leadframe, the secondary leadframe and the magnetic core in a molding.

12. The method of claim 1, further comprising providing an auxiliary coil electrically isolated from the secondary coil, the auxiliary coil being configured to conduct a current flow and being inductively coupled to the secondary coil through the magnetic core, wherein a current flow in the auxiliary coil produces a magnetic field in the magnetic core, and the magnetic field in the magnetic core induces a current flow in the secondary coil.

13. The method of claim 12, further comprising:
embedding the auxiliary coil an auxiliary mold compound to form an auxiliary leadframe;
disposing the primary leadframe, the auxiliary leadframe, and the secondary leadframe in a step formation; and
encasing the primary leadframe, the auxiliary leadframe, the secondary leadframe, and the magnetic core in a molding.

14. A method for forming a magnetics package, the method comprising:
providing a primary coil configured to conduct a current flow;
providing a substrate having a surface and a secondary coil extending from the surface, the secondary coil configured to conduct a current flow;
encapsulating the secondary coil in a secondary mold compound;
removing the substrate from the secondary coil, thereby leaving the secondary coil embedded in the secondary mold compound while exposing at least a portion of the secondary coil; and
inductively coupling the secondary coil to the primary coil through a magnetic core, the secondary coil is electrically isolated from the primary coil, wherein a current flow in the primary coil produces a magnetic field in the magnetic core, and the magnetic field in the magnetic core induces a current flow in the secondary coil.

15. The method of claim 14, further comprising:
providing an auxiliary coil; and
positioning the primary coil below the auxiliary coil, wherein the auxiliary coil and the primary coil are embedded in a first mold compound.

16. The method of claim 15, further comprising encapsulating the auxiliary coil, the primary coil, and the secondary coil in an over-molding compound, wherein the over-molding compound provides a space within the magnetics package for the magnetic core.

17. The method of claim 14, wherein the primary coil is co-aligned with the secondary coil with respect to an axis perpendicular to the primary coil.

18. The method of claim 14, wherein the primary coil is vertically co-aligned with the secondary coil.

19. The method of claim 14, wherein the secondary coil is arranged in a helix.

20. The method of claim 14, wherein the primary coil is patterned on a flex substrate.

* * * * *